(12) United States Patent
Arghavani et al.

(10) Patent No.: US 7,253,123 B2
(45) Date of Patent: Aug. 7, 2007

(54) METHOD FOR PRODUCING GATE STACK SIDEWALL SPACERS

(75) Inventors: Reza Arghavani, Scotts Valley, CA (US); Michael Chiu Kwan, Sunnyvale, CA (US); Li-Qun Xia, Santa Clara, CA (US); Kang Sub Yim, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 287 days.

(21) Appl. No.: 11/032,859

(22) Filed: Jan. 10, 2005

(65) Prior Publication Data

US 2006/0154493 A1 Jul. 13, 2006

(51) Int. Cl.
*H01L 21/31* (2006.01)
*H01L 21/469* (2006.01)

(52) U.S. Cl. .......... 438/786; 257/E21.17; 257/E21.478

(58) Field of Classification Search .......... 257/E21.17, 257/E21.478; 427/255.27, 255.28; 438/786, 438/788
See application file for complete search history.

(56) References Cited

U.S. PATENT DOCUMENTS

| | | | |
|---|---|---|---|
| 6,147,009 A | 11/2000 | Grill et al. | |
| 6,169,021 B1 | 1/2001 | Akram et al. | |
| 6,228,758 B1* | 5/2001 | Pellerin et al. | 438/624 |
| 6,251,802 B1 | 6/2001 | Moore et al. | |
| 6,340,435 B1 | 1/2002 | Bjorkman et al. | |
| 6,383,951 B1* | 5/2002 | Li | 438/781 |
| 6,462,371 B1 | 10/2002 | Weimer et al. | |
| 6,465,366 B1 | 10/2002 | Nemani et al. | |
| 6,514,671 B1 | 2/2003 | Parikh et al. | |
| 6,537,733 B2 | 3/2003 | Campana et al. | |
| 6,541,397 B1 | 4/2003 | Bencher | |
| 6,547,977 B1 | 4/2003 | Yan et al. | |
| 6,573,030 B1 | 6/2003 | Fairbairn et al. | |
| 6,627,532 B1 | 9/2003 | Gaillard et al. | |
| 6,656,837 B2 | 12/2003 | Xu et al. | |
| 6,743,732 B1 | 6/2004 | Lin et al. | |
| 6,762,127 B2 | 7/2004 | Boiteux et al. | |
| 6,764,958 B1 | 7/2004 | Nemani et al. | |
| 6,794,311 B2 | 9/2004 | Huang et al. | |
| 6,821,571 B2 | 11/2004 | Huang | |

(Continued)

FOREIGN PATENT DOCUMENTS

WO 00/22671 A1 4/2000

OTHER PUBLICATIONS

U.S. Appl. No. 10/828,023, filed Apr. 19, 2004, Rajagopalam et al.

(Continued)

*Primary Examiner*—Caridad Everhart
(74) *Attorney, Agent, or Firm*—Patterson & Sheridan

(57) ABSTRACT

A method for forming sidewall spacers on a gate stack by depositing one or more layers of silicon containing materials using PECVD process(es) on a gate structure to produce a spacer having an overall k value of about 3.0 to about 5.0. The silicon containing materials may be silicon carbide, oxygen doped silicon carbide, nitrogen doped silicon carbide, carbon doped silicon nitride, nitrogen doped silicon oxycarbide, or combinations thereof. The deposition is performed in a plasma enhanced chemical vapor deposition chamber and the deposition temperature is less than 450° C. The sidewall spacers so produced provide good capacity resistance, as well as excellent structural stability and hermeticity.

24 Claims, 2 Drawing Sheets

U.S. PATENT DOCUMENTS

| | | |
|---|---|---|
| 6,893,967 B1 | 5/2005 | Wright et al. |
| 2001/0034121 A1* | 10/2001 | Fu et al. .................... 438/636 |
| 2002/0016085 A1 | 2/2002 | Huang et al. |
| 2002/0054962 A1 | 5/2002 | Huang |
| 2003/0129827 A1 | 7/2003 | Lee et al. |
| 2004/0033678 A1 | 2/2004 | Argharvani et al. |
| 2004/0072446 A1 | 4/2004 | Liu et al. |
| 2004/0101667 A1* | 5/2004 | O'Loughlin et al. ........ 428/209 |
| 2004/0115876 A1* | 6/2004 | Goundar et al. ............ 438/200 |
| 2004/0175929 A1 | 9/2004 | Campana et al. |
| 2004/0192032 A1* | 9/2004 | Ohmori et al. ............. 438/655 |
| 2005/0003676 A1 | 1/2005 | Ho et al. |
| 2005/0026430 A1 | 2/2005 | Kim et al. |
| 2005/0236694 A1* | 10/2005 | Wu et al. ................... 257/632 |
| 2005/0266691 A1 | 12/2005 | Gu et al. |
| 2005/0287771 A1 | 12/2005 | Seamons et al. |
| 2006/0033678 A1 | 2/2006 | Lubomirsky et al. |
| 2006/0102076 A1 | 5/2006 | Smith et al. |
| 2006/0261490 A1* | 11/2006 | Su et al. .................... 257/775 |

OTHER PUBLICATIONS

U.S. Appl. No. 11/365,740, filed Feb. 28, 2006, Entitled: Low K Spacer Integration Into CMOS Transistors (APPM/010133).

* cited by examiner

METHOD FOR PRODUCING GATE STACK SIDEWALL SPACERS

BACKGROUND OF THE INVENTION

1. Field of the Invention

Embodiments of the present invention generally relate to a method for producing sidewall spacers for gate stacks on semiconductor substrates.

2. Description of the Related Art

Ultra-large-scale integrated (ULSI) circuits typically include more than one million transistors that are formed on a semiconductor substrate and which cooperate to perform various functions within an electronic device. Such transistors may include complementary metal-oxide-semiconductor (CMOS) field effect transistors.

A CMOS transistor includes a gate structure that is disposed between a source region and a drain region defined in the semiconductor substrate. The gate structure (stack) generally comprises a gate electrode formed on a gate dielectric material. The gate electrode controls a flow of charge carriers, beneath the gate dielectric, in a channel region that is formed between the drain region and the source region, so as to turn the transistor on or off. Typically disposed proximate the gate stack is a spacer layer, which forms a sidewall on either side thereof. Sidewall spacers serve several functions, including, electrically isolating the gate electrode from source and drain contacts or interconnects, protecting the gate stack from physical degradation during subsequent processing steps, and providing an oxygen and moisture barrier to protect the gate metal. One example of such a sidewall spacer arrangement is disclosed in U.S. patent application Ser. No. 10/397,776, filed Mar. 25, 2003.

A conventional gate stack is formed from materials having dielectric constants of less than about 5 ($k<5$) and is typically protected by a silicon nitride spacer. Further reduction in transistor sizes will likely require gate layers having dielectric constants of greater than 10 ($k>10$). If the sidewall spacer is then fabricated from a relatively high k ($k>7$) material, such as silicon nitride, excessive signal crosstalk between adjacent interconnection lines can occur during use of the device containing the completed gate electrode. While ultra-low k materials ($k<3$) may be employed as a spacer layer, these materials often lack the necessary structural integrity to survive subsequent processing steps and/or requisite oxygen and moisture imperviousness to protect the gate metal from corrosion.

In addition, conventional thermal chemical vapor deposition (CVD) process used to prepare silicon nitride spacer requires high deposition temperature, which is typically greater than 600° C. The nitride spacer deposited at high temperature has very good conformality (e.g. $\geq 95\%$); however, the high deposition temperature results in large thermal cycle for the gate device and is not compatible with advanced device manufacturing for 0.09 micron technology and beyond.

Therefore, there is a need for low temperature, and low k sidewall spacers for low k gate stacks, wherein the sidewall spacer possesses the desired physical properties of structural stability and hermeticity.

SUMMARY OF THE INVENTION

The present invention provides a method for forming sidewall spacers on a gate stack by depositing one or more layers of silicon containing materials using plasma enhanced chemical vapor deposition (PECVD) process(es) on a gate stack to produce a spacer having an overall dielectric constant of about 3.0 to about 5.0 at a temperature equaling to or below 450° C.

In one embodiment, a method for forming a sidewall spacer for a gate electrode comprises placing a substrate having a gate structure in a plasma process chamber, flowing process gas(es) into the plasma process chamber, creating a plasma in the plasma process chamber, and depositing one or more layers of silicon containing materials on the gate structure at a temperature equaling to or less than 450° C., wherein the one or more layers of silicon containing materials have an overall k value of about 3.0 to about 5.0.

In another embodiment, a method for forming a sidewall spacer for a gate electrode comprises placing a substrate having a gate structure in a plasma process chamber, flowing process gas(es) into the plasma process chamber, creating a plasma in the plasma process chamber, and depositing one or more layers of silicon containing materials on the gate structure, wherein the one or more layers of silicon containing materials have an overall k value of about 3.0 to about 5.0, and the one or more layers of silicon containing materials are selected from the group consisting of silicon carbide, oxygen doped silicon carbide, nitrogen doped silicon carbide, carbon doped silicon nitride, nitrogen doped silicon oxycarbide, and combinations thereof.

In yet another embodiment, a method for forming a sidewall spacer for a gate electrode comprises placing a substrate having a gate structure in a plasma process chamber, flowing process gas(es) into the plasma process chamber, creating a plasma in the plasma process chamber, and depositing one or more layers of silicon containing materials on the gate structure at a temperature equaling to or below 450° C., wherein the one or more layers of silicon containing materials have an overall k value of about 3.0 to about 5.0, and the one or more layers of silicon containing materials are selected from the group consisting of silicon carbide, oxygen doped silicon carbide, nitrogen doped silicon carbide, carbon doped silicon nitride, nitrogen doped silicon oxycarbide, and combinations thereof.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention encompasses forming sidewall spacers for gate stacks by applying a silicon-based film to a gate structure. In some embodiments, a spacer layer is formed by deposition of silicon carbide, oxygen doped silicon carbide, nitrogen doped silicon carbide, or carbon doped silicon nitride adjacent a gate dielectric. In another embodiment, the spacer layer is formed by deposition of carbon doped silicon oxynitride.

Figure 1:
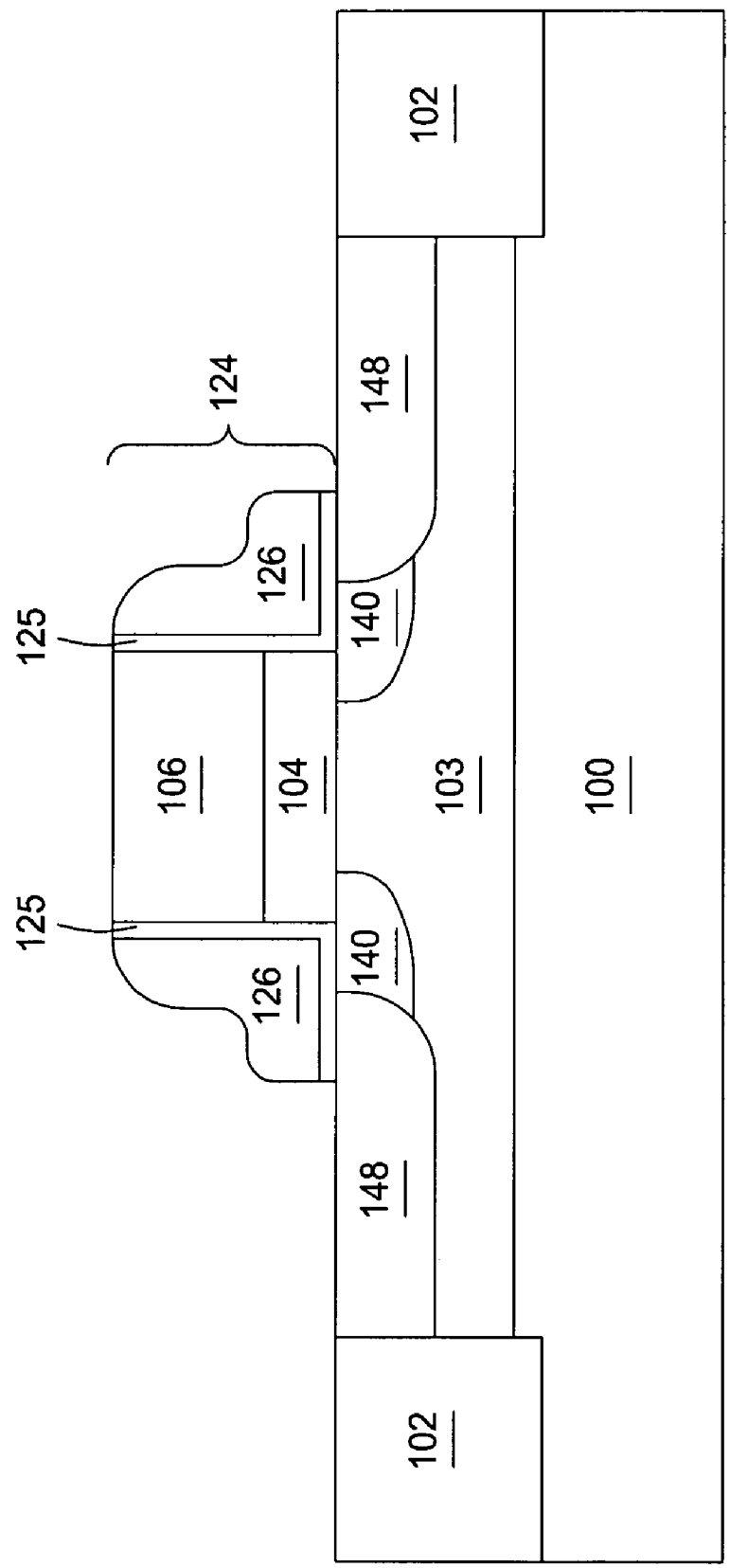
FIG. 1 illustrates a transistor comprising a gate structure formed according to one embodiment of the invention.

FIG. 1 illustrates a transistor having a gate structure formed according to one embodiment of the invention. Referring to FIG. 1, a plurality of field isolation regions 102 are formed in a substrate 100 (e.g., a silicon wafer). The plurality of field isolation regions 102 isolate a well 103 of one type conductivity (e.g., p-type) from adjacent wells (not shown) of other type conductivity (e.g., n-type). Then, a gate dielectric layer 104 is formed on the substrate 100 and on isolation regions 102. Typically, gate dielectric layer 104 may be formed by depositing or growing a layer of a material such as silicon oxide ($SiO_n$) and/or silicon oxynitride, which form layers having a dielectric constant less than about 5.0. Recent advances in gate dielectric technology indicate that higher dielectric constant materials (K>10) are desirable for forming gate dielectric layer 104. Examples of suitable materials to be employed therefor include, but are not limited to, metal oxides ($Al_2O_3$, $ZrO_2$, $HfO_2$, $TiO_2$, $Y_2O_3$, and $La_2O_3$), ferroelectrics (lead zirconate titanate (PZT) and barium strontium titanate (BST)), amorphous metal silicates ($HfSi_xO_y$ and $ZrSi_xO_y$), amorphous silicate oxides ($HfO_2$, and $ZrO_2$), and paralectrics ($Ba_xSr_{1-x}TiO_3$ and $PbZr_xTi_{1-x}O_3$). High k layers containing these materials may be formed by various deposition processes.

Further, an electrically conductive gate electrode layer 106 is blanket deposited over gate dielectric layer 104. Generally, the gate electrode layer 106 may comprise a material such as, but not limited to, doped polysilicon, undoped polysilicon, silicon carbide, or silicon-germanium compounds. However, contemplated embodiments may encompass a gate electrode layer 106 containing a metal, metal alloy, metal oxide, single crystalline silicon, amorphous silicon, silicide, or other material well known in the art for forming gate electrodes.

A hard-mask layer (not shown), such as a nitride layer, is deposited via a CVD process over electrically conductive layer 106. A photolithography process is then carried out including the steps of masking, exposing, and developing a photoresist layer to form a photoresist mask (not shown). The pattern of the photoresist mask is transferred to the hard-mask layer by etching the hard-mask layer to the top of the gate electrode layer 106, using the photoresist mask to align the etch, thus producing a hard-mask (not shown) over the gate electrode layer 106.

The structure is further modified by removing the photoresist mask and etching the gate electrode layer 106 down to the top of the dielectric layer 104, using the hard-mask to align the etch, thus creating a conductive structure including the remaining material of gate electrode layer 106 underneath the hard-mask. This structure results from etching the gate electrode layer 106, but not the hard-mask or gate dielectric layer 104. Continuing the processing sequence, gate dielectric layer 104 is etched to the top of the substrate 100 and to the tops of the isolation regions 102. The gate electrode 106 and the gate dielectric 104 together define a composite structure 124, sometimes known as a gate stack, or gate, of an integrated device, such as a transistor.

In further processing of the transistor, tips, or shallow source/drain extensions, 140, are formed by utilizing a tip implant process. The gate electrode 106 protects the substrate region beneath the gate dielectric 104 from being implanted with ions. A rapid thermal process (RTP) anneal may then be performed to drive the tips 140 partially underneath the gate dielectric 104.

Next, a conformal thin oxide layer 125 is deposited over the entire substrate surface. This oxide layer is used to protect the silicon surface from the spacer layer, which is a silicon nitride layer for conventional process. The conformal thin oxide layer is typically deposited with TEOS source gas in a low pressure chemical vapor deposition chamber at high temperature (>600° C.). It relaxes the stress between silicon substrate and nitride spacer and it also protect the gate corners from the silicon nitride spacer. If low k and non-silicon-nitride material is used as sidewall spacer, this conformal thin oxide layer 125 can possibly be eliminated or be replaced by other low k material.

Figure 2:
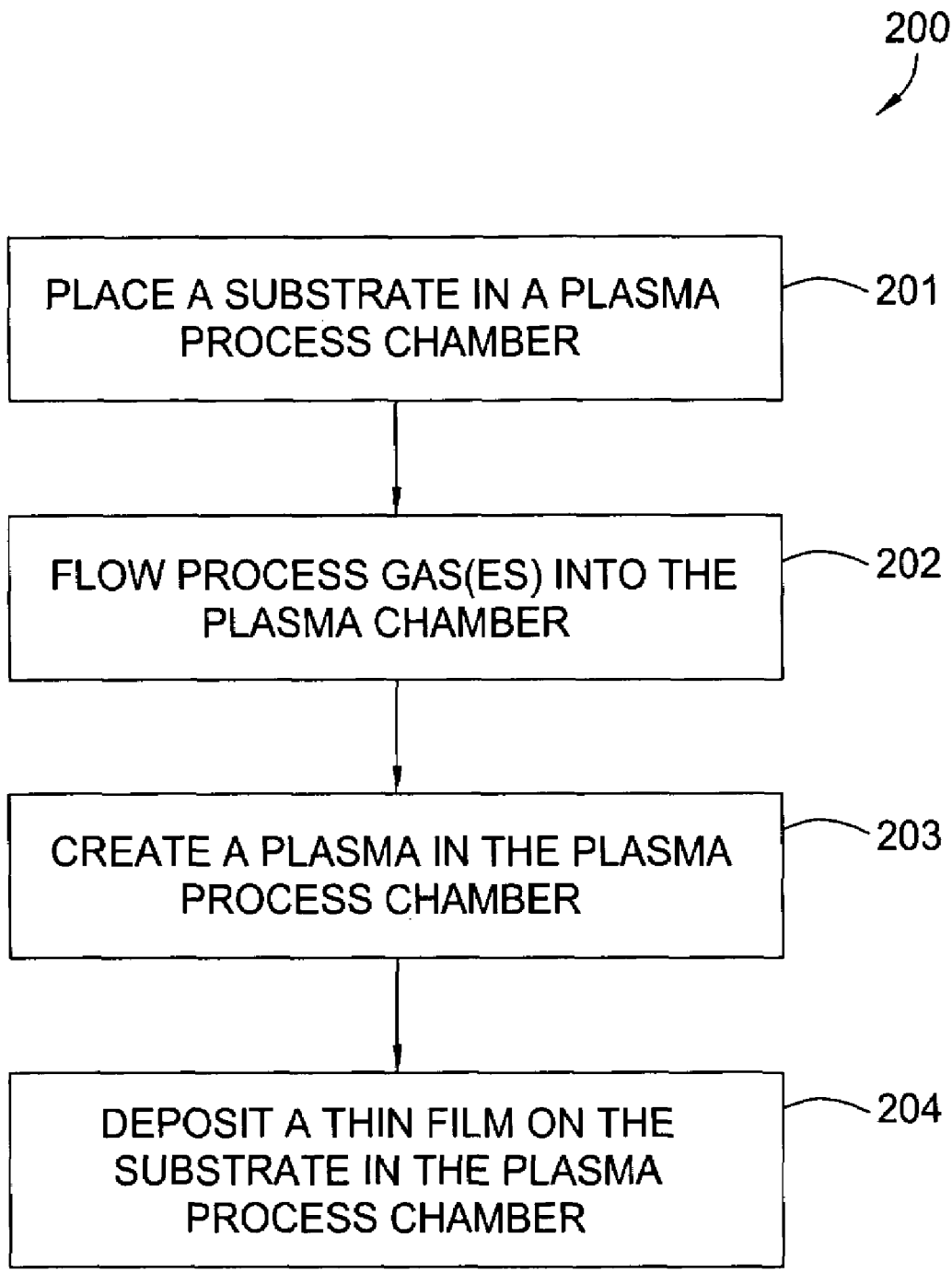
FIG. 2 shows the process flow of thin film deposition in a PECVD chamber.

Afterwards, in one embodiment of the invention, a spacer layer 126, with thickness in the range between about 200 Å to about 1000 Å, preferably between about 400 Å to about 800 Å, is blanket deposited over the top of the gate stack 124 and along the entire length of the sides of the composite structure_124, including the entire length of the sidewalls of the gate electrode 106 and the gate dielectric 104. At the same time, the spacer layer 126 is deposited on top of any exposed portion of the substrate 100 or isolation regions 102. Conventional spacer layer is a silicon nitride layer deposited by thermal CVD. For advanced device manufacturing, the dielectric constant (k value) of silicon nitride (k value about 7) is too high that could result in excessive signal crosstalk. In addition, a thermal CVD process used to deposit silicon nitride requires high deposition temperature (>600° C.). The high deposition temperature results in high thermal cycle and could change the dopant profile of tip 140. Therefore, it is desirable to have a spacer layer deposition process with lower deposition temperature. Plasma Enhanced Chemical Vapor Deposition (PECVD) process typically has lower deposition temperature. For a silicon nitride layer deposited by a plasma process, the deposition temperature can be lowered to 450° C. or less. The process of depositing a thin film in a plasma process chamber is shown in FIG. 2. The process starts at step 201 by placing a substrate in a plasma process chamber. Next at step 202, flow process gas(es) into the plasma process chamber. Then at step 203, create a plasma in the plasma process chamber. At step 204, deposit a thin film on the substrate in the plasma process chamber. The conformality of the spacer layer deposited by plasma process is not as good as the thermal CVD process. Using silicon nitride as an example, silicon nitride by thermal CVD has conformality close to 100%, while silicon nitride by PECVD has conformality at about 75%. Although spacer layer by PECVD process has lower conformality than thermal CVD process, the benefit of lower thermal cycle (or thermal budget) could out weigh the shortcoming of lower conformality. Therefore, it is desirable to have a low k spacer layer deposited by PECVD.

The spacer layer 126 and thin oxide layer 125 are then etched to remove the spacer layer 126 and thin oxide layer 125 from the top of the gate electrode 106 as well as from the top surface of the isolation regions 102 and from most of the top surface of the substrate 100 except immediately to either side of the gate stack 124. The anisotropic etch, however, leaves a portion of the spacer layer 126 and thin oxide layer 125 along the entire length of the sidewalls of both the gate electrode 106 and the gate dielectric 104, thus forming a sidewall spacer 126. Alternatively, the sidewall spacers 126 may be deposited as a single layer or as two or more sequentially deposited layers.

Next, the substrate 100 is subjected to a deep, high dose implant process to form deep junction source/drain regions 148 in the well region 103. The deep implant includes implanting ions with the same conductivity type impurities used to form the tips 140. At the same time, if the electrically conductive gate electrode comprises polysilicon, the deep implant process can be used to dope the polysilicon in the gate electrode 106 if not previously doped. An activation anneal may be performed to activate the tips 140 and deep implants 148. The anneal may be performed with a rapid thermal process (RTP).

The foregoing embodiment of a transistor structure and method of its formation are merely illustrative. Additional embodiments of gate electrodes and alternative methods for their formation may be employed to practice the invention. Further details concerning exemplary methods and apparatuses for forming gate stacks are disclosed in commonly assigned U.S. patent application Ser. No. 10/612,642, filed Jul. 1, 2003, which claims priority to U.S. provisional patent application Ser. No. 60/393,393, filed Jul. 2, 2002, both of which are incorporated herein by reference to the extent not inconsistent herewith.

In various embodiments of the present invention, spacer film (layer) 126 may be formed of silicon carbide, oxygen doped silicon carbide, nitrogen doped silicon carbide, carbon doped silicon nitride, nitrogen doped silicon oxycarbide, or combinations thereof. In these embodiments, the resulting spacer layer 126 has a k value of about 3.0 to about 5.0. In addition, the deposition is performed by PECVD process at temperature less than 450° C.

In one embodiment, the spacer layer 126 is formed from silicon carbide by reacting a gas mixture including a silicon source, a carbon source, and an inert gas under plasma conditions in a PECVD chamber, such as DxZ™ chamber. DxZ™ chamber is commercially available from Applied Materials Inc., located in Santa Clara, Calif. In one embodiment, the process temperature is between about 200° C. to about 400° C. The silicon source and the carbon source may be a single source, such as an organosilane compound having the general formula $Si_xC_yH_z$. For example, methylsilane ($SiH_3CH_3$), dimethylsilane ($SiH_2(CH_3)_2$), trimethylsilane ($SiH(CH_3)_3$), tetramethylsilane ($Si(CH_3)_4$), diethylsilane ($SiH_2(C_2H_5)_2$), and Bis(trimethylsilyl)ethylene ($C(Si(CH_3)_3)_2$), and combinations thereof, among others may be used to provide silicon and carbon. Alternatively, compounds including, but not limited to, silane ($SiH_4$), disilane ($Si_2H_6$), and combinations thereof may be used as the silicon source, and compounds having the general formula $C_xH_{2x+2}$, including but not limited to, methane ($CH_4$), compounds having the general formula $C_xH_{2x}$, including but not limited to, ethylene ($C_2H_4$), and combinations thereof, may be employed as the carbon source. Helium (He), argon (Ar), nitrogen ($N_2$), or combinations thereof, among others, may be used for the inert gas. Further details of the methods for depositing silicon carbide layers and the physical properties thereof are disclosed in commonly assigned U.S. Pat. No. 6,465,366, which is incorporated herein by reference to the extent not inconsistent herewith.

An as-deposited silicon carbide layer has a dielectric constant of about 3.0 to about 5.0. The dielectric constant of the silicon carbide layer is tunable, in that it can be varied as a function of the ratio of the mixed frequency RF powers. In particular, as the ratio of the low frequency RF power to the total mixed RF power decreases the dielectric constant of the as-deposited silicon carbide layer also decreases. The dielectric constant of the silicon carbide layer can also be tuned as a function of the composition of the gas mixture during layer formation. As the carbon concentration in the gas mixture increases, the carbon content of the as-deposited silicon carbide layer increases, decreasing its dielectric constant. Also, as the carbon content of the as-deposited silicon carbide layer increases the hydrophobic properties thereof increase.

In another embodiment, the spacer layer 126 is formed from an oxygen doped silicon carbide by reacting a processing gas including one or more oxygen-containing organosilicon compounds and one or more oxygen-free organosilicon compounds to form a dielectric layer comprising carbon-silicon bonds and having a dielectric constant of about 3.5 to about 5.0. The oxygen-containing organosilicon compounds have a general structure of $Si_wC_xH_yO_z$. The oxygen-free organosilicon compounds have a general structure of $Si_xC_yH_z$. Suitable organosilicon compounds for the processes described herein include aliphatic organosilicon compounds, cyclic organosilicon compounds, or combinations thereof. Aliphatic organosilicon compounds have linear or branched structures. Commercially available aliphatic organosilicon compounds include oxygen-free organosilicon compounds, such as alkylsilanes and oxygen-containing organosilicon compounds, such as alkylsiloxanes.

The processes described herein are preferably performed in a plasma processing chamber adapted to deposit organosilicon material while applying RF power, such as a DxZ™ plasma enhanced chemical vapor deposition chamber. In one embodiment, the deposition temperature is between about 250° C. to about 450° C. Generally, the organosilicon compounds are reacted in a plasma comprising a noble gas, such as helium (He) or argon (Ar), or an inert gas, such as nitrogen ($N_2$). Further details of the methods for depositing oxygen doped silicon carbide layers and the physical properties thereof are disclosed in commonly assigned U.S. Pat. No. 6,890,850, filed Jul. 15, 2002, which claims priority to U.S. provisional patent application Ser. No. 60/340,615, filed Dec. 14, 2001, both of which are incorporated herein by reference to the extent not inconsistent herewith.

In another embodiment, the oxygen doped silicon carbide layer is formed by depositing a silicon carbide layer and then introducing oxygen to that layer by supplying an oxygen containing gas under plasma conditions. The plasma treatment with an oxygen containing gas could be performed in a PECVD chamber, such as DxZ™ chamber. In one embodiment, the plasma treatment temperature is maintained in the range between about 0° C. to about 500° C., and preferably between about 100° C. to about 450° C. The oxygen doped silicon carbide film has about 1 to about 30 atomic percent oxygen content and a dielectric constant of about 3.5 to about 5.0. In one embodiment, the oxygen-free organosilicon compound(s) and an oxygen-containing organosilicon compound(s) react to deposit an oxygen doped silicon carbide film having about 1 to about 30 atomic percent oxygen content and a dielectric constant of about 3.5 to about 5.0. In one embodiment, the deposition is performed in a PECVD chamber and the temperature is maintained at between about −20° C. to about 500° C., and preferably between about 170° C. to about 180° C. The dielectric constant of the oxygen doped silicon carbide layer is tunable, in that it can be varied as a function of the reactants employed, reactant and inert gas flow rates, chamber temperature, and applied RF frequencies. Further details of the methods for producing an oxygen doped silicon carbide layer by oxygen doping of a silicon carbide layer are disclosed in commonly assigned U.S. Pat. No. 6,821,571, filed Jun. 18, 1999, and U.S. Pat. No. 6,913,992, filed Mar. 7, 2003, both of which are incorporated herein by reference to the extent not inconsistent herewith.

In another embodiment, the spacer layer 126 is formed from a nitrogen doped silicon carbide by reacting a gas mixture including a silicon source, a carbon source, and a nitrogen source. Herein the term "nitrogen doped silicon carbide" designates materials containing silicon, nitrogen, carbon, and optionally hydrogen, wherein the nitrogen content is less than the carbon content. In one embodiment, the as-deposited nitrogen doped silicon carbide layer contains about 1 to about 30 atomic percent nitrogen and has a dielectric constant of about 4.0 to about 5.0. The deposition could be performed in a PECVD chamber, such as DxZ™ chamber. In one embodiment, the substrate temperature is maintained in the range between about 150° C. to about 450° C. The dielectric constant of the nitrogen doped silicon carbide layer is tunable, in that it can be varied as a function of the RF power applied during the deposition process. In particular, as the RF power increases the dielectric constant of the as-deposited nitrogen doped silicon carbide layer_also increases. Additionally, the dielectric constant can be varied as a function of the nitrogen source and/or concentration thereof in the gas mixture. In particular, as the nitrogen dopant content increases, the dielectric constant of the deposited nitrogen doped silicon carbide layer decreases. Further details of the methods for depositing nitrogen doped silicon carbide layers and the physical properties thereof are disclosed in commonly assigned U.S. Pat. No. 6,764,958, filed Jul. 28, 2000, and U.S. Pat. No. 6,537,733, both of which are incorporated herein by reference to the extent not inconsistent herewith.

In another embodiment, the nitrogen doped silicon carbide layer is formed by nitridation of a silicon carbide layer. Therein, a silicon carbide layer, prepared by a plasma process, is exposed to a plasma of a nitrating gas to form a nitrogen rich surface on the silicon carbide layer. The plasma treatment with an oxygen containing gas could be performed in a PECVD chamber, such as DxZ™ chamber or a Producer™ PECVD chamber, both of which are available from Applied Materials, Inc. of Santa Clara, Calif. In one embodiment, the substrate temperature is maintained in the range between about 100° C. to about 450° C. The nitrogen rich surface of the silicon carbide layer may include silicon nitride or silicon carbon nitride and is referred to herein as a nitrided surface. The nitrating gas is selected from the group including, but not limited to, ammonia ($NH_3$), nitrogen ($N_2$), nitrous oxide ($N_2O$), and combinations thereof. In addition, the nitridation process may include an inert gas such as argon (Ar) or helium (He). The as-deposited nitrogen doped silicon carbide layer contains about 1 to about 30 atomic percent nitrogen and has a dielectric constant of about 4.0 to about 5.0. Further details of the methods for depositing nitrogen doped silicon carbide layers by nitridation of silicon carbide layers are disclosed in commonly assigned U.S. Pat. No. 6,794,311, filed Jul. 10, 2001, which is incorporated herein by reference to the extent not inconsistent herewith.

In another embodiment, the spacer layer 126 is formed from carbon doped silicon nitride by reacting a gas mixture including a silicon source, a carbon source, and a nitrogen source. Herein the term "carbon doped silicon nitride" designates materials containing silicon, nitrogen, carbon, and optionally hydrogen, wherein the carbon content is less than the nitrogen content. Such a layer may be formed, for example, by reacting one or more nitrogen containing compounds with one or more organosilicon compounds. The deposition can be conducted in a PECVD chamber, such as Producer™ chamber. In one embodiment, the deposition temperature is between about 100° C. to about 500° C., and preferably between about 250° C. to about 450° C. The as-deposited carbon doped silicon nitride layer contains about 1 to about 30 atomic percent carbon and has a dielectric constant of about 4.0 to about 5.0. The dielectric constant of the carbon doped silicon nitride layer is tunable, in that it can be varied as a function of reaction pressure and the nitrogen source and/or concentration thereof in the gas mixture. Further details of the methods and apparatus for depositing carbon doped silicon nitride layers are disclosed in commonly assigned U.S. patent application Ser. No. 10/828,023, filed Apr. 19, 2004, and U.S. provisional patent application Ser. No. 60/525,241, filed Nov. 25, 2003, both of which are incorporated herein by reference to the extent not inconsistent herewith.

In another embodiment, the spacer layer 126 is formed from nitrogen doped silicon oxycarbide. Herein, the term "nitrogen doped silicon oxycarbide" is used to refer to compounds containing silicon, carbon, oxygen, and nitrogen. In one embodiment, the nitrogen doped silicon oxycarbide of the present invention is formed by reacting one or more organosilicon source gases with one or more oxygen source gases and one or more nitrogen source gases. The dielectric constant of the nitrogen doped silicon oxycarbide is between about 3.0 to about 5.0. In one embodiment, the deposition process can be conducted in a PECVD chamber and the deposition temperature is between about −20° C. to about 500° C., and preferably between about 170° C. to about 180° C. In one embodiment, after deposition, the deposited material is annealed at a temperature between about 100° C. to about 400° C. to reduce moisture content and to increase the solidity and hardness of the deposited material. In one embodiment, the deposited material is plasma treated at a temperature between about 300° C. to about 450° C. to reduce the surface's reactivity to subsequently deposited materials. The dielectric constant of the nitrogen doped silicon oxycarbide layer is tunable, in that it can be varied as a function of the reactants employed and the reactor temperature. Further details of the methods for depositing nitrogen doped silicon oxycarbide layers are disclosed in commonly assigned U.S. Pat. No. 6,656,837 and U.S. Pat. No. 6,627,532, both of which are incorporated herein by reference to the extent not inconsistent herewith.

While the abovementioned materials may be deposited as a single layer to form a sidewall spacer, the present invention is not so limited. One or more layers of material may be deposited sequentially or simultaneously under plasma conditions in plasma enhanced chemical vapor deposition reactors at temperature equaling to or less than 450° C. to produce a composite spacer layer having an overall k value of about 3.0 to about 5.0. This may be accomplished by applying one or more layers of material, each having a k value of about 3.0 to about 5.0. Alternatively, this may be accomplished by applying one or more layers of material, any of which may have a k value greater than or less than about 3.0 to about 5.0, such that the composite spacer layer has a k value of about 3.0 to about 5.0.

While the foregoing is directed to embodiments of the present invention, other and further embodiments of the invention may be devised without departing from the basic scope thereof, and the scope thereof is determined by the claims that follow.

The invention claimed is:

1. A method for forming a sidewall spacer for a gate electrode, comprising:
   placing a substrate having a gate structure in a plasma process chamber;
   flowing process gas(es) into the plasma process chamber;
   creating a plasma in the plasma process chamber; and
   depositing one or more layers of silicon containing materials on the gate structure at a temperature equal to or less than 450° C. in the presence of the plasma, wherein the one or more layers of silicon containing materials have an overall dielectric constant value of about 3.0 to about 5.0 and comprise materials selected from the group consisting of silicon carbide, oxygen doped silicon carbide, nitrogen doped silicon carbide, carbon doped silicon nitride, nitrogen doped silicon oxycarbide, and combinations thereof.

2. The method of claim 1, wherein the sidewall spacer is formed as a single layer.

3. The method of claim 1 wherein the sidewall spacer comprises silicon carbide.

4. The method of claim 3, wherein the dielectric constant of the silicon carbide is varied by changing a ratio of mixed frequency power of the plasma process chamber during deposition.

5. The method of claim 3, wherein the dielectric constant of the silicon carbide is varied by changing a gas mixture used to deposit the silicon carbide.

6. The method of claim 1, wherein the silicon containing materials comprise oxygen doped silicon carbide.

7. The method of claim 6, wherein the dielectric constant of the oxygen doped silicon carbide is varied by changing a ratio of mixed frequency power to the plasma process chamber.

8. The method of claim 6, wherein the dielectric constant of the oxygen doped silicon carbide is varied by changing the process gases or process gas flow rates.

9. The method of claim 6, wherein the dielectric constant of the oxygen doped silicon carbide is varied by changing the deposition temperature.

10. The method of claim 1, wherein the silicon containing materials comprise nitrogen doped silicon carbide.

11. The method of claim 10, wherein the nitrogen doped silicon carbide has a nitrogen content of less than about 30 atomic percent.

12. The method of claim 10, wherein the dielectric constant of the nitrogen doped silicon carbide is increased by increasing RF power.

13. The method of claim 12, wherein the dielectric constant of the nitrogen doped silicon carbide is varied by adjusting a nitrogen source used during deposition and/or a concentration of the nitrogen source in a deposition gas mixture.

14. The method of claim 1, wherein the silicon containing materials comprise nitrogen doped silicon carbide and the nitrogen doped silicon carbide is formed by plasma nitridation of silicon carbide.

15. The method of claim 14, wherein the nitrogen doped silicon carbide has a nitrogen content of less than about 30 atomic percent.

16. The method of claim 14, wherein the plasma nitridation is performed at a temperature between about 100° C. to about 450° C.

17. The method of claim 1, wherein the silicon containing materials comprise carbon doped silicon nitride.

18. The method of claim 17, wherein the carbon doped silicon nitride has a carbon content of less than about 30 atomic percent.

19. The method of claim 17, wherein the dielectric constant of the carbon doped silicon nitride is varied by adjusting a reaction pressure, a nitrogen source used during deposition and a concentration of gases in a deposition gas mixture.

20. The method of claim 1, wherein the silicon containing materials comprise carbon doped silicon oxynitride.

21. The method of claim 20, wherein the dielectric constant of the carbon doped silicon oxynitride is varied by adjusting a deposition temperature.

22. The method of claim 20, wherein the dielectric constant of the carbon doped silicon oxynitride is varied by adjusting reactants used to form the carbon doped silicon oxynitride.

23. A method for forming a sidewall spacer for a gate electrode, comprising:
    placing a substrate having a gate structure in a plasma process chamber;
    flowing process gas(es) into the plasma process chamber;
    creating a plasma in the plasma process chamber; and
    depositing one or more layers of silicon containing materials on the gate structure in the presence of the plasma, wherein the one or more layers of silicon containing materials have an overall dielectric constant value of about 3.0 to about 5.0, and the one or more layers of silicon containing materials are selected from the group consisting of silicon carbide, oxygen doped silicon carbide, nitrogen doped silicon carbide, carbon doped silicon nitride, nitrogen doped silicon oxycarbide, and combinations thereof.

24. A method for forming a sidewall spacer for a gate electrode, comprising:
    placing a substrate having a gate structure in a plasma process chamber;
    flowing process gas(es) into the plasma process chamber;
    creating a plasma in the plasma process chamber; and
    depositing one or more layers of silicon containing materials on the gate structure at a temperature equaling to or below 450° C. in the presence of the plasma, wherein the one or more layers of silicon containing materials have an overall dielectric constant value of about 3.0 to about 5.0, and the one or more layers of silicon containing materials are selected from the group consisting of silicon carbide, oxygen doped silicon carbide, nitrogen doped silicon carbide, carbon doped silicon nitride, nitrogen doped silicon oxycarbide, and combinations thereof.

* * * * *